(12) United States Patent
Schaller et al.

(10) Patent No.: US 9,496,117 B2
(45) Date of Patent: Nov. 15, 2016

(54) TWO-DIMENSIONAL MASS RESOLVING SLIT MECHANISM FOR SEMICONDUCTOR PROCESSING SYSTEMS

(71) Applicant: Varian Semiconductor Equipment Associates, Inc., Gloucester, MA (US)

(72) Inventors: Jason M. Schaller, Austin, TX (US); Robert B. Vopat, Austin, TX (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 196 days.

(21) Appl. No.: 14/158,972

(22) Filed: Jan. 20, 2014

(65) Prior Publication Data
US 2015/0206701 A1 Jul. 23, 2015

(51) Int. Cl.
*G21K 1/04* (2006.01)
*H01J 37/05* (2006.01)
*H01J 37/317* (2006.01)
*H01J 37/09* (2006.01)

(52) U.S. Cl.
CPC ............... *H01J 37/05* (2013.01); *H01J 37/09* (2013.01); *H01J 37/3171* (2013.01); *H01J 2237/0455* (2013.01); *H01J 2237/057* (2013.01); *H01J 2237/1501* (2013.01)

(58) Field of Classification Search
None
See application file for complete search history.

(56) References Cited

U.S. PATENT DOCUMENTS

| | | | | |
|---|---|---|---|---|
| 4,017,403 A | * | 4/1977 | Freeman | H01J 49/30 250/298 |
| 4,847,504 A | * | 7/1989 | Aitken | H01J 27/022 250/423 R |
| 5,391,870 A | * | 2/1995 | Purser | H01J 49/32 250/298 |
| 5,629,528 A | * | 5/1997 | Jost | H01J 37/09 250/492.21 |
| 5,920,076 A | * | 7/1999 | Burgin | H01J 27/022 250/423 R |
| 6,093,625 A | * | 7/2000 | Wagner | H01J 37/3171 250/492.21 |
| 6,501,078 B1 | * | 12/2002 | Ryding | H01J 37/08 250/396 R |

(Continued)

FOREIGN PATENT DOCUMENTS

JP 62115640 A * 5/1987
JP 63057766 A * 3/1988

*Primary Examiner* — Andrew Smyth (57) ABSTRACT

An adjustable mass-resolving slit assembly includes an aperture portion and an actuation portion. The aperture portion includes first and second shield members that define an aperture therebetween for receiving an ion beam during semiconductor processing operations. The actuation portion is coupled to the aperture portion and selectively and independently adjusts the position of the first and second shield members along first and second non-parallel axes. Adjusting the position of the first and second shield members along the first axis adjusts a width of the aperture. Adjusting the position of the first and second shield members along the second axis adjusts a region of the first and second shield members impinged by the ion beam. Methods for using the adjustable mass-resolving slit assembly are also disclosed.

20 Claims, 9 Drawing Sheets

(56) References Cited

U.S. PATENT DOCUMENTS

| | | | | |
|---|---|---|---|---|
| 6,720,563 | B1* | 4/2004 | Kabasawa | H01J 37/304 250/492.1 |
| 8,198,610 | B2* | 6/2012 | McRay | H01J 37/09 250/492.21 |
| 2002/0096650 | A1* | 7/2002 | Tsukihara | H01J 37/08 250/492.1 |
| 2002/0121613 | A1* | 9/2002 | Scheuer | H01J 37/16 250/492.1 |
| 2006/0035396 | A1* | 2/2006 | Simmons | C23C 14/564 438/16 |
| 2007/0014112 | A1* | 1/2007 | Ohya | G03F 7/70066 362/268 |
| 2007/0114455 | A1* | 5/2007 | Naito | H01J 37/05 250/492.21 |
| 2008/0081298 | A1* | 4/2008 | Tanaka | G03F 7/70383 430/319 |
| 2010/0009275 | A1* | 1/2010 | Mikami | G03F 7/70091 430/30 |
| 2010/0072402 | A1* | 3/2010 | Satoh | H01J 27/024 250/492.21 |
| 2010/0116983 | A1* | 5/2010 | Benveniste | H01J 37/05 250/298 |
| 2011/0089334 | A1* | 4/2011 | McRay | H01J 37/09 250/398 |
| 2012/0298854 | A1* | 11/2012 | Hamby | H01J 37/023 250/282 |
| 2014/0134833 | A1* | 5/2014 | Tsukihara | H01J 37/302 438/514 |

* cited by examiner

TWO-DIMENSIONAL MASS RESOLVING SLIT MECHANISM FOR SEMICONDUCTOR PROCESSING SYSTEMS

BACKGROUND OF THE INVENTION

Field of the Invention

Embodiments of the invention relate to semiconductor processing in general, and in particular to a system for adjusting a mass-resolving slit during semiconductor processing applications.

Discussion of Related Art

Ion implantation is a process of depositing chemical species into a substrate by bombardment of the substrate with energized ions. In semiconductor manufacturing, ion implanters are used for doping processes that alter the type and level of conductivity of target materials. A precise doping profile in an integrated circuit (IC) substrate and its thin-film structure is important for proper IC performance. To achieve a desired doping profile, one or more ion species may be implanted in different doses and at different energy levels.

Figure 1:
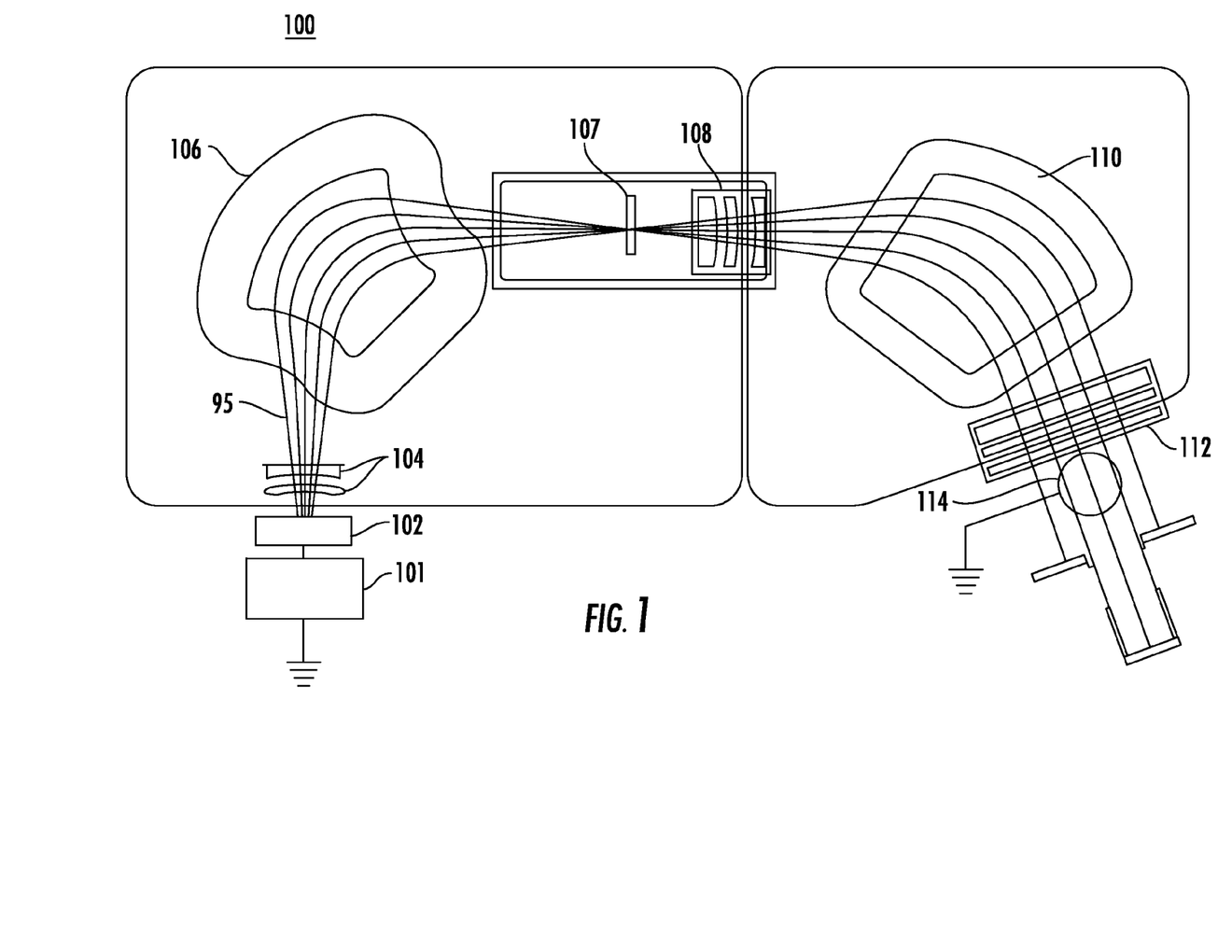
FIG. 1 is a schematic illustration of an exemplary ion implant system.

FIG. 1 is a block diagram of an embodiment of an ion implantation system 100 including an ion source 102, which is a hybrid ion source whose operation is detailed below. A power supply 101 supplies the required energy to source 102 which is configured to generate ions of a particular species. The generated ions are extracted from the source through a series of electrodes 104 (extraction electrodes) and formed into a beam 95 which is manipulated and directed to a substrate using various beam components 106, 108, 110, 112. After extraction, the beam 95 passes through a mass analyzer magnet 106. The mass analyzer is configured with a particular magnetic field such that only the ions with a desired mass-to-charge ratio are able to travel through the analyzer. Ions of the desired species pass through a mass-resolving slit assembly 107, then through a deceleration stage 108 to a corrector magnet 110. The corrector magnet 110 is energized to deflect ion beamlets in accordance with the strength and direction of the applied magnetic field to provide a ribbon beam targeted toward a work piece or substrate positioned on support (e.g. platen) 114. In some cases, a second deceleration stage 112 may be disposed between corrector magnet 110 and support 114. The ions lose energy when they collide with electrons and nuclei in the substrate and come to rest at a desired depth within the substrate based on the acceleration energy.

As noted, the mass resolving slit assembly 107 includes an aperture through which the ion beam 95 passes during the ion implant process. Through careful sizing of the aperture, the mass resolving slit assembly 107 can function to separate desired dopant ions from contamination species that would adversely affect the quality of semiconductor devices. As will be appreciated, a portion of the ion beam 95 impinges on a portion of the mass resolving slit assembly, rapidly eroding the edges of the assembly immediately adjacent to the aperture. As a result, the edge portions of the mass resolving slit assembly 107 must be replaced at an undesirably short interval.

SUMMARY OF THE INVENTION

In view of the above, it would be desirable to provide a mass resolving slit assembly that is capable of operating for longer periods between replacements. It would also be desirable to provide a method for operating a mass resolving slit assembly that would increase the time between replacements.

This Summary is provided to introduce a selection of concepts in a simplified form that are further described below in the Description of Embodiments. This Summary is not intended to identify key features or essential features of the claimed subject matter, nor is it intended as an aid in determining the scope of the claimed subject matter.

An adjustable mass-resolving slit assembly, comprising an aperture portion comprising first and second shield members that define an aperture therebetween for receiving an ion beam during semiconductor processing operations, and an actuation portion coupled to the aperture portion. The actuation portion may be configured for selectively and independently adjusting a position of the first and second shield members along first and second non-parallel axes. Thus arranged, adjusting the position of the first and second shield members along the first axis adjusts a width of the aperture, while adjusting the position of the first and second shield members along the second axis adjusts a region of the first and second shield members impinged by the ion beam.

A method is disclosed for adjusting a mass-resolving slit in ion implantation system. The method may include adjusting a relative position of first and second shield members along a first axis to adjust the width of an aperture formed therebetween, and adjusting a position of the first and second shield members along a second axis to select a region on the first and second shield members against which an ion beam impinges. The second axis may be non-parallel to the first axis.

An adjustable mass-resolving slit assembly is disclosed. The adjustable mass-resolving slit assembly may include an aperture portion comprising first and second shield members that define an aperture therebetween for receiving an ion beam during semiconductor processing operations. The assembly may further include an actuation portion coupled to the aperture portion, where the actuation portion comprises first and second support shafts coupled to the first and second shield members. The first and second support shafts may further be coupled to associated first and second support shaft housings positioned on a base plate of the actuation portion. The first support shaft housing may be movable along a first axis with respect to the base plate, while the second support shaft housing may be fixed along the first axis with respect to the base plate. The first and second support shaft housings may be movable along a second axis that is non-parallel to the first axis. Adjusting the position of the first and second shield members along the first axis may adjust a width of the aperture. Adjusting the position of the first and second shield members along the second axis may adjust a region of the first and second shield members impinged by the ion beam.

BRIEF DESCRIPTION OF THE DRAWINGS

The accompanying drawings illustrate embodiments of the disclosed method so far devised for the practical application of the principles thereof, and in which.

DESCRIPTION OF EMBODIMENTS

Figure 2:
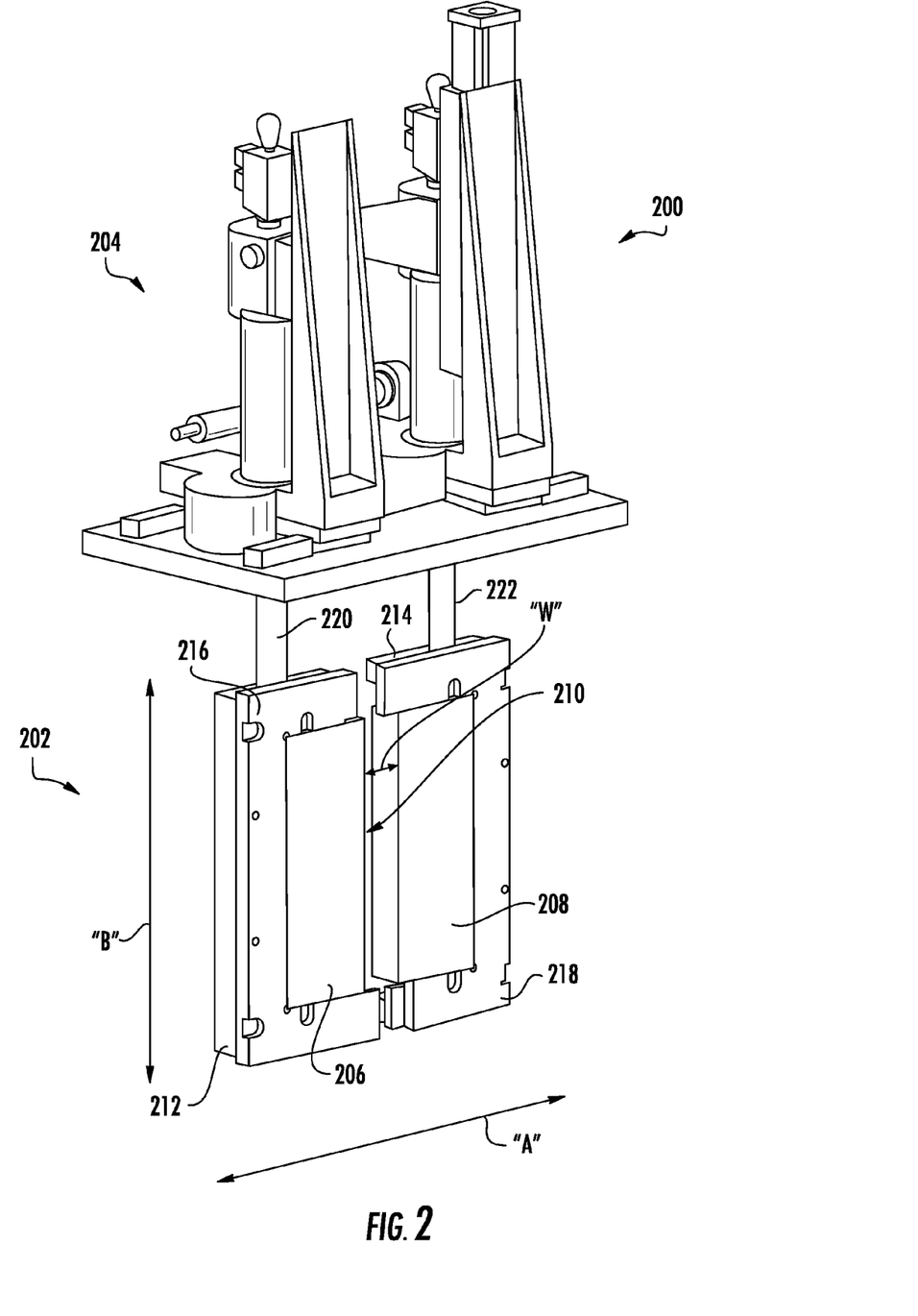
FIG. 2 is an isometric view of an exemplary embodiment of the disclosed adjustable mass-resolving slit assembly.
Figure 3:
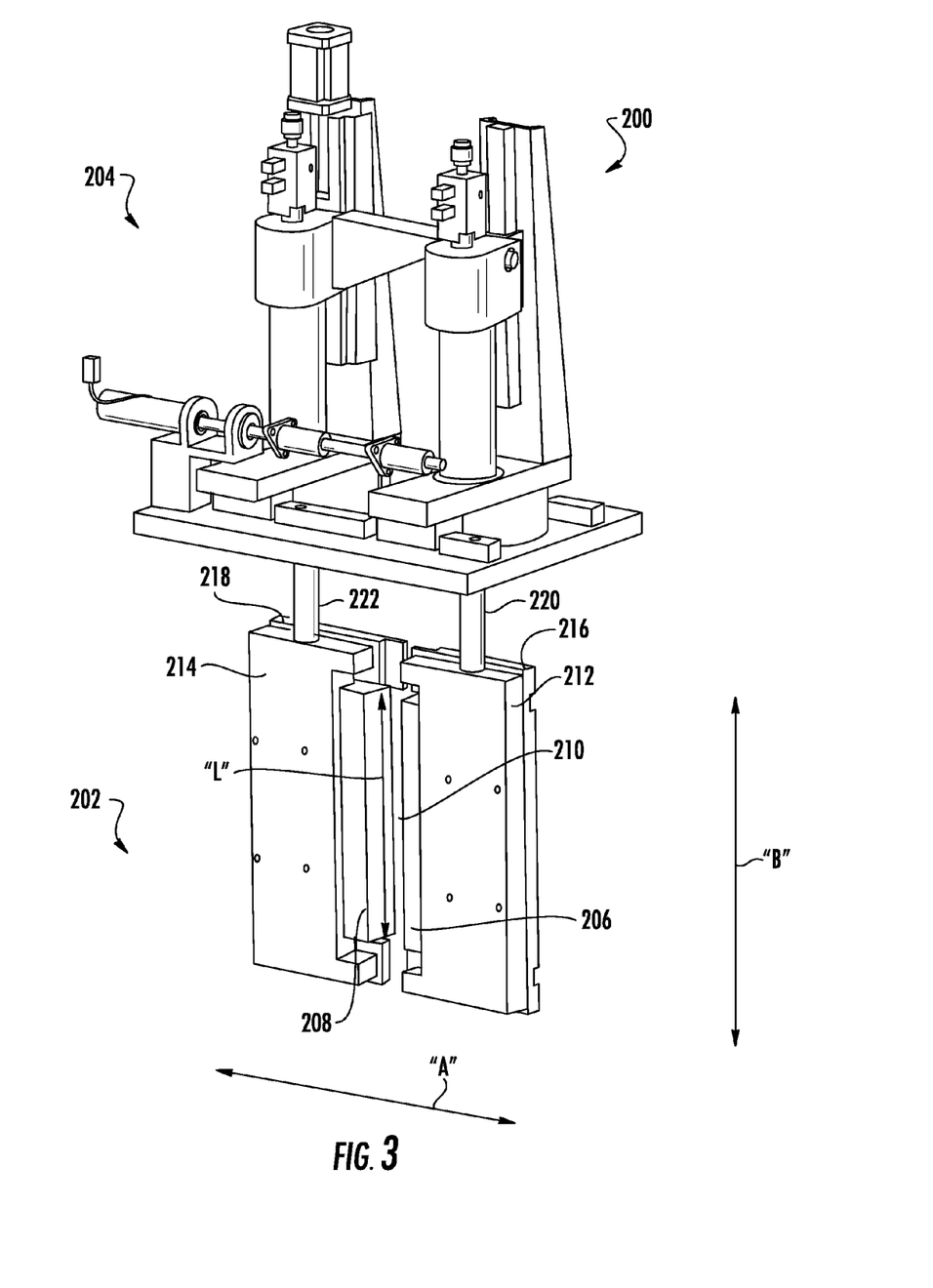
FIG. 3 is a reverse isometric view of the adjustable mass-resolving slit assembly of FIG. 2.

Referring to FIGS. 2 and 3, the disclosed mass resolving slit assembly 200 includes an aperture portion 202 and an actuation portion 204. The aperture portion 202 can include first and second shield members 206, 208 that define an aperture 210 therebetween through which an ion beam can pass during semiconductor processing operations. The actuation portion 204 interacts with the aperture portion 202 to selectively move the first and second shield members 206, 208 along two non-parallel axes. The first axis (indicated by double arrow "A") enables first and second shield members 206, 208 to be adjusted horizontally to form the aperture 210 through which an ion beam can pass for to achieve an ion implant beam tuning and analysis process. By adjusting the relative positions of the first and second shield members 206, 208 along the first axis "A," the aperture 210 may be adjusted to an aperture width "W" of a desired magnitude. In non-limiting exemplary embodiments, this width "W" may be from about 0-inches to about 2.5-inches. The second axis (indicated by double arrow "B") enables the first and second shield members 206, 208 to be adjusted vertically to change the lateral position on the first and second shield members 206, 208 that will be impinged by the ion beam. As will be described in greater detail later, by adjusting this lateral position of beam impingement, additional material is provided for the ion beam to erode before the first and second shield members 206, 208 should be replaced. Thus, the wear of the first and second shield members 206, 208 can be uniformly controlled across the length "L" of each of the first and second shield members, thus extending the overall service life of the first and second shield members.

As noted, the aperture portion 202 includes the first and second shield members 206, 208. The aperture portion 202 may also include first and second paddle members 212, 214 and first and second frame members 216, 218, that engage and hold the first and second shield members 206, 208 in desired position with respect to each other. The first and second paddle members 212, 214 may be releasably engageable with the first and second frame members 216, 218, respectively, to enable the first and second shield members 206, 208 to be replaced.

The first and second paddle members 212, 214 may further be coupled to the actuation portion 204 via first and second support shafts 220, 222. The actuation portion 204 may move the first and second support shafts 220, 222 in a desired manner to move the first and second paddle members 212, 214 (and thus the first and second shield members 206, 208) along the first and second axes "A," "B."

In some embodiments the first and second shield members 206, 208 are made from graphite, though other suitable materials may also be used. In addition, the first and second paddle members 212, 214 and the first and second frame members 216, 218 may be made from stainless steel, though other suitable materials can also be used.

Figure 4:
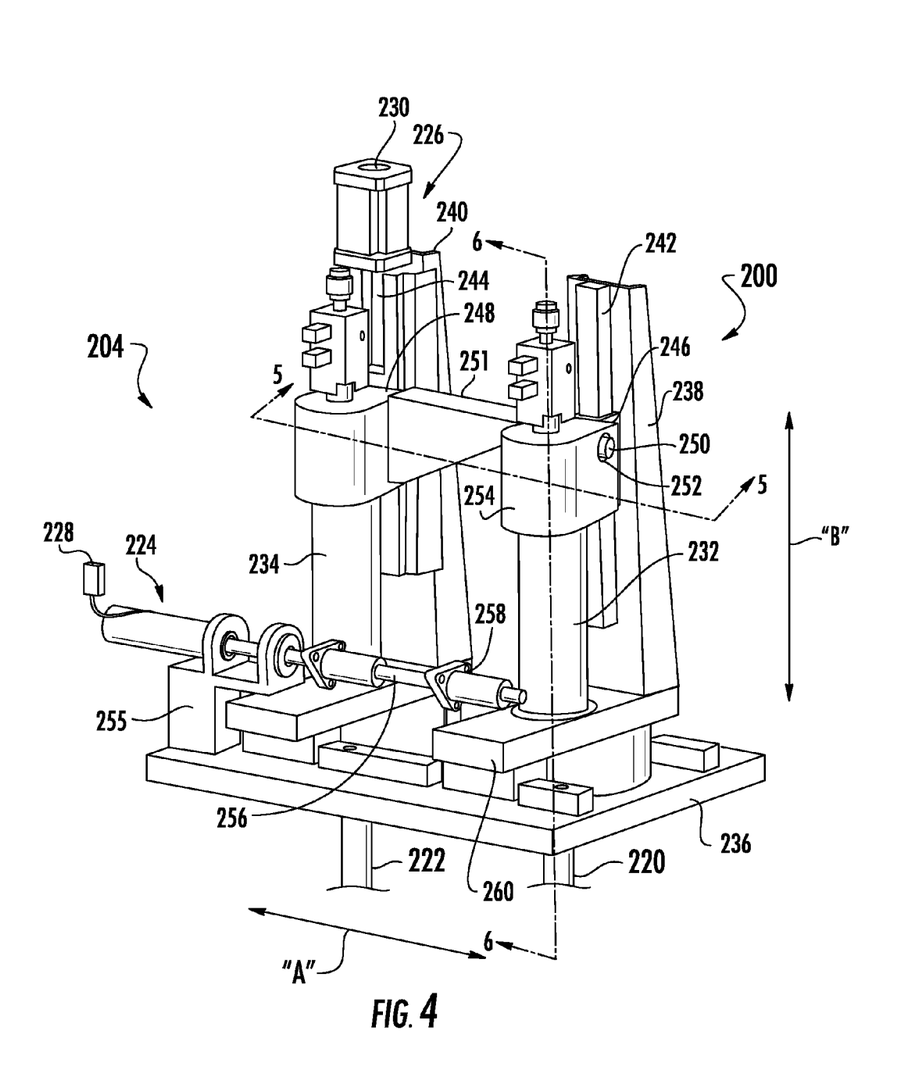
FIG. 4 is an isometric view of an exemplary actuation portion of the adjustable mass-resolving slit assembly of FIG. 2.

FIG. 4 shows the actuation portion 204 in greater detail. The actuation portion 204 can include a first linear actuator 224 for adjusting the position of the first and second support shafts 220, 222 with respect to each other along the first axis "A", and a second linear actuator 226 for moving the first and second support shafts 220, 222 along the second axis "B." In one embodiment the first and second linear actuators 224, 226 may each include a servo motor 228, 230 coupled to an associated lead screw (not shown).

The first and second support shafts 220, 222 may be coupled to associated first and second support shaft housings 232, 234 positioned on a base plate 236 of the actuation portion 204. The first and second support shaft housings 232, 234 may be fixed along the second axis "B" with respect to the base plate 236. The first support shaft housing 232 may be movable along the first axis "A" with respect to the base plate 236, while the second support shaft housing 234 may be fixed along the first axis with respect to the base plate. Thus arranged, the first and second support shafts 220, 222 are movable up and down (along second axis "B") within their respective first and second support shaft housings 232, 234. The first support shaft 220, along with the first support shaft housing 232, are movable toward or away from the second support shaft 222 (and the second support shaft housing) along first axis "A."

The first and second support shaft housings 232, 234 may be coupled to respective first and second housing frames 238, 240 which themselves are mounted to the base plate 236. The first and second housing frames 238, 240 are positioned adjacent to their respective first and second support shaft housings 232, 234 and can each have a guide track 242, 244 for slidingly engaging a guide portion 246, 248 of the associated first or second support shaft housing. As arranged, the first and second support shaft housings 232, 234 can slide on the first and second housing frames along the second axis "B."

In the illustrated embodiment, the second linear actuator 226 is coupled to the second housing frame 240 to controllably move the second support shaft housing 234 (and the second support shaft 222) to a desired position along the second axis "B." In some embodiments the first and second support shaft housings 232, 234 may be coupled together so that movement of the second support shaft housing 234 along the second axis "B" causes the first support shaft housing 232 to move along the second axis by the same amount. In one embodiment, the coupling comprises a shaft 250 fixed to a second flange portion 251 of the second support shaft housing 234. The shaft 250 may be received in a correspondingly sized recess 252 formed in a first flange portion 254 associated with the first support shaft housing 232. The shaft 250 and recess 252 may be oriented to align with the second axis "B" so that the first and second support shaft housings can move with respect to each other along the first axis "A," while still be coupled together for purposes of movement along the second axis "B."

The first linear actuator 224 may be coupled to the base plate 236 of the actuation portion 204 via an actuator frame 255. The first linear actuator 224 may have a lead screw 256 that is received within a lead screw bracket 258 coupled to a base portion 260 of the first housing frame 238. The lead screw bracket 258 may have threads that cooperate with threads of the lead screw 256 such that when the lead screw is rotated in a first direction the threads cause the lead screw bracket and the first housing frame 238 to move in a first direction along the first axis "A." Opposite directional rotation of the lead screw 256 may cause the lead screw bracket and the first housing frame 238 to move in a second, opposite, direction along the first axis "A." Since the first support shaft 220 is coupled to the first housing frame 238 (via the first support shaft housing 232), rotation of the lead screw 256 can cause the first support shaft 220 along the first axis "A." As previously noted, the position of the second support shaft 222 is fixed along the first axis "A," so by moving the first support shaft 220 along the first axis the relative positions of the first and second support shafts can be adjusted. This, in turn, allows the relative positions of first and second shield members 206, 208 to be adjusted along the first axis "A," so that the aperture 210 width "W" can be adjusted.

Figure 5:
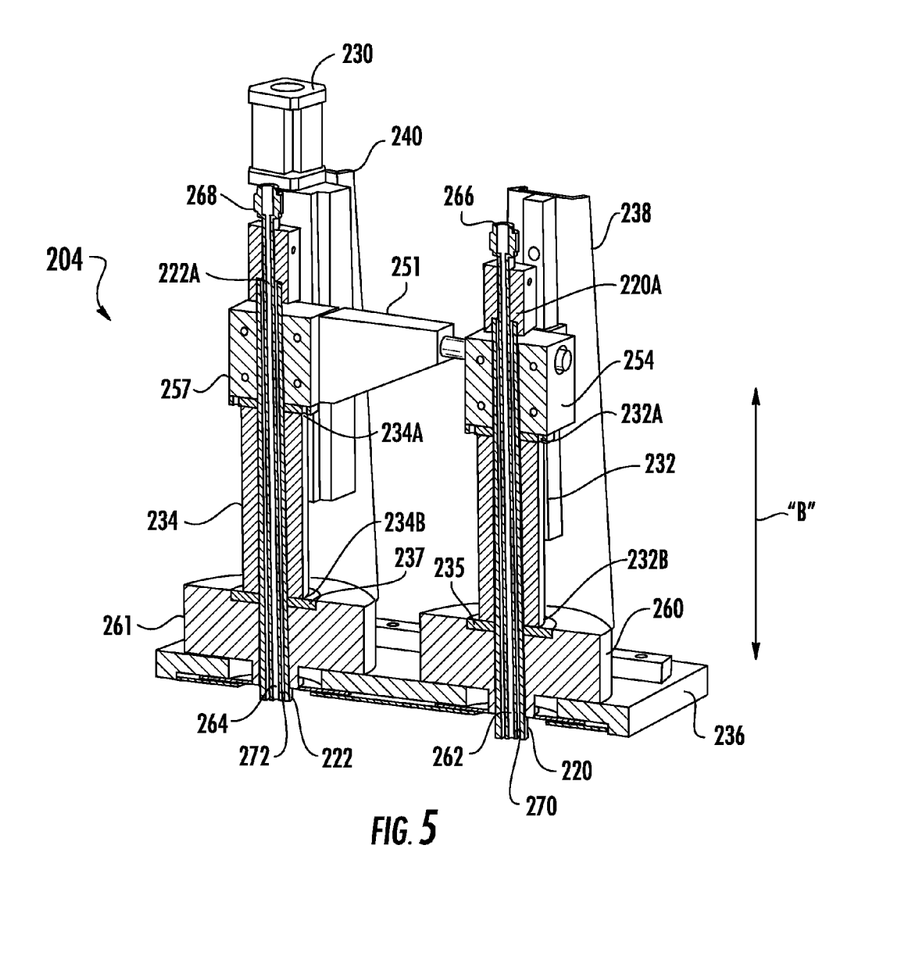
FIG. 5 is a cross-section view taken along line 5-5 of FIG. 4.

In one non-limiting exemplary embodiment, the first and second support shaft housings 232, 234 comprise bellows elements that can expand and contract as desired to facilitate movement of the first and second support shafts 220, 222 along the second axis "B." As shown in FIG. 5, first ends 220A, 222A of the first and second support shafts 220, 222 are coupled to the first flange portion 254 of the first support shaft housing 232 and the second flange portion 257 of the second support shaft housing 234, respectively. The first flange and second flange portions 254, 257 in turn, are coupled to respective first ends 232A, 234A of the first and second support shaft housings 232, 234. Second ends 232B, 234B of the first and second support shaft housings 232, 234 are coupled to a first and second support shaft flanges 235, 237 which themselves are received in recesses in the base portions 260, 261 of the first and second housing frames 238, 240. Thus, as the first and second support shafts 220, 220 move along the second axis "B," the first and second support shaft housings 232, 234 expand and contract along the second axis to accommodate that motion. In some embodiments, the first and second support shaft housings 232, 234 are configured to accommodate up to about six (6) inches of travel of the first and second support shafts 220, 222 along the second axis "B." It will be appreciated that this is not limiting, and that the first and second support shaft housings 232, 234 can be configured to provide greater or lesser travel, as desired.

Figure 6:
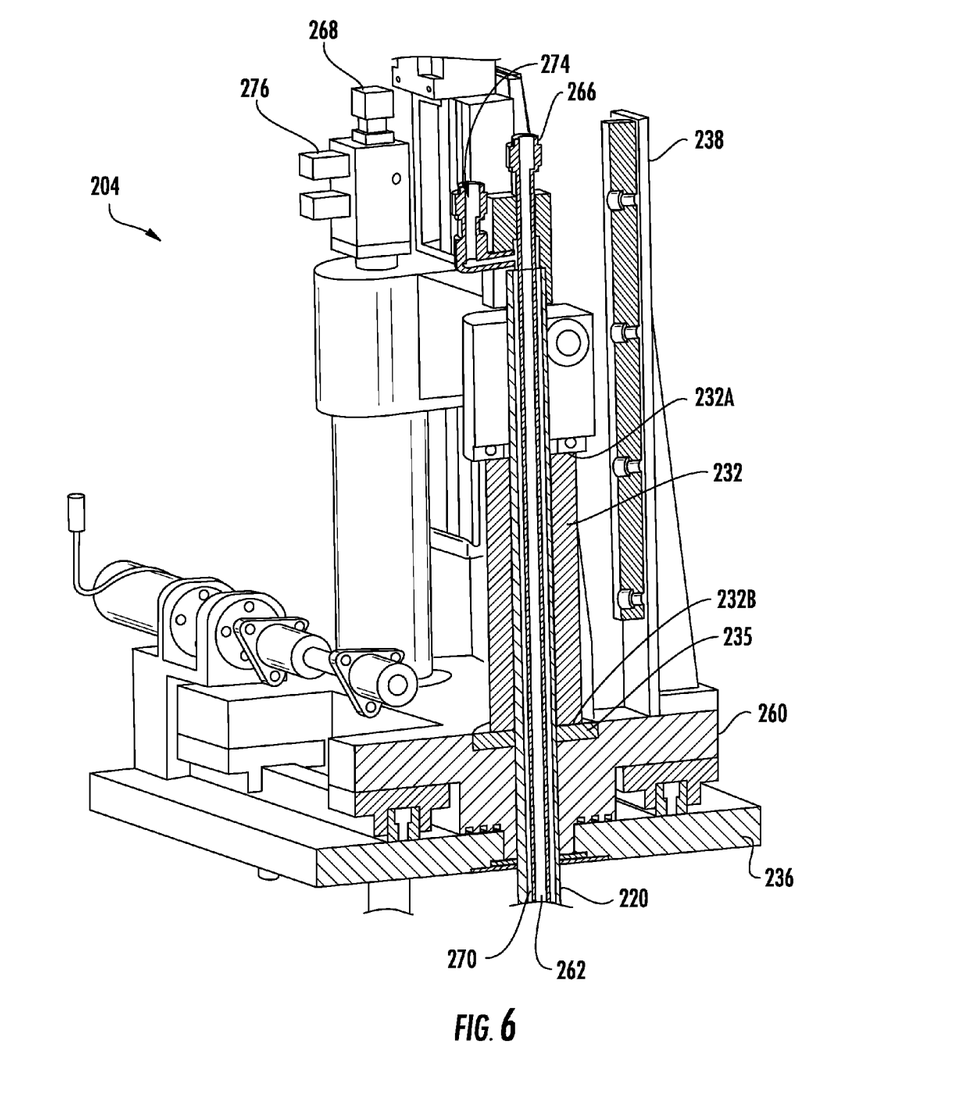
FIG. 6 is a cross-section view taken along line 6-6 of FIG. 4.

As will be appreciated, impingement of the ion beam with the first and second shield members 206, 208 can generate substantial heat in the components of the aperture portion 202. Thus, the first and second paddle members 212, 214 may include coolant channels (not shown) through which coolant fluid can be circulated to control the temperature of the aperture portion 202. As shown in FIGS. 5 and 6, the first and second support shafts 220, 222 may include respective first and second coolant fluid paths 262, 264 in communication with the coolant channels of the first and second paddle members 212, 214 (FIG. 2). The first and second coolant fluid paths 262, 264 may run the lengths of the first and second support shafts 220, 222, and may be coupled to an external coolant recirculation system (not shown) via respective connections 266, 268 disposed at the first ends 220A, 222A of the first and second support shafts. First and second return coolant fluid paths 270, 272 comprise annular channels formed around the first and second coolant fluid paths 262, 264 to enable recirculation fluid flow via the first and second support shafts. Thus, relatively low temperature coolant may flow to the first and second paddle members via the first and second coolant fluid paths 262, 264, while relatively warmer coolant may flow back to the coolant recirculation system via the first and second return coolant fluid paths 270, 272. FIG. 6 shows the positioning of a return fluid connection 274 for coupling the first return coolant fluid path 270 to the coolant recirculation system. A similar coupling 276 can be provided for the second return coolant fluid path 272.

Figure 7:
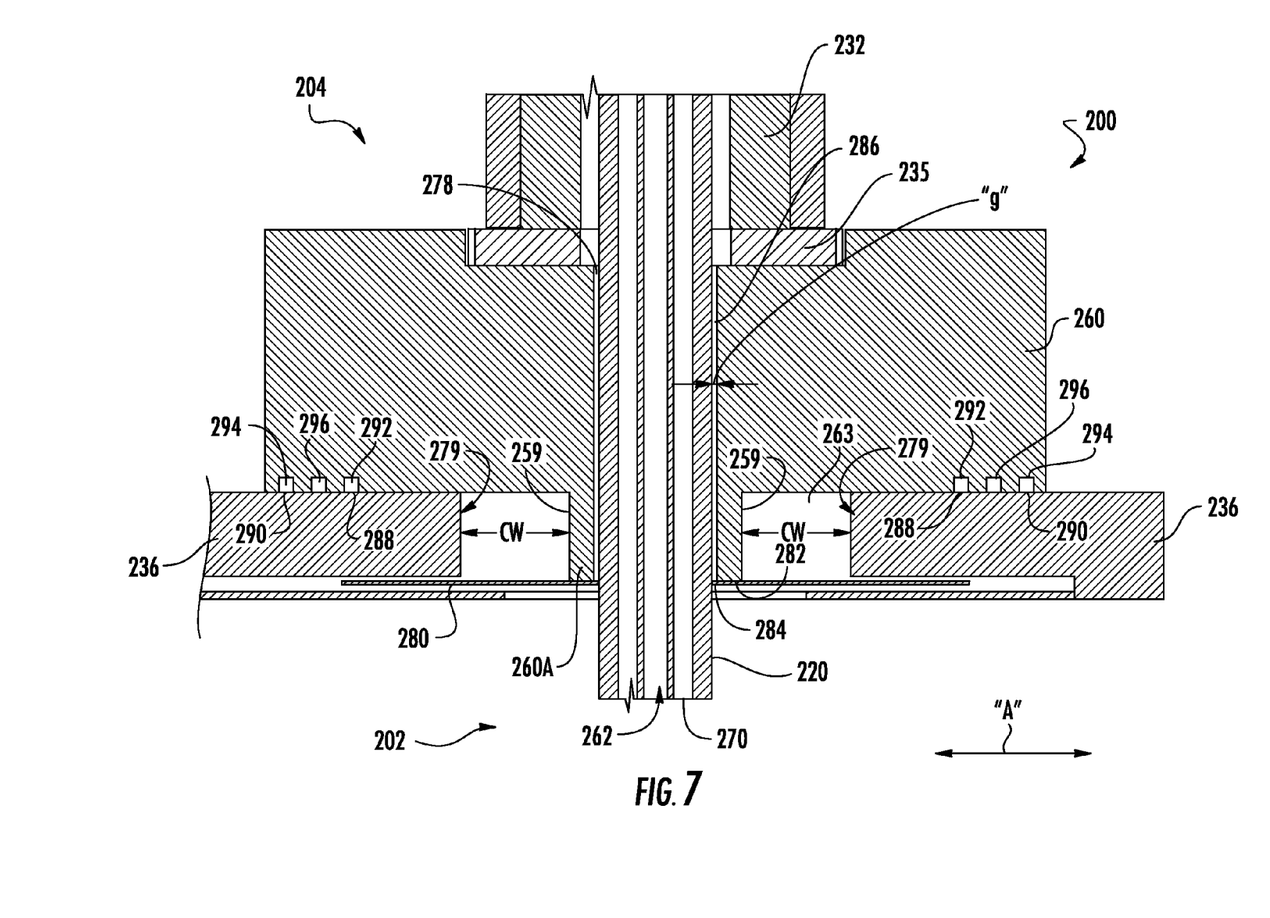
FIG. 7 is a detail view of the cross-section view of FIG. 6.

As will be appreciated, the aperture portion 202 can be located within the vacuum environment of the ion implantation system 100, while the actuation portion 204 can be located outside vacuum environment. Since the first and second support shafts 220, 222 are movable, a sealing arrangement that accommodates such movement is provided. Referring to FIG. 7, the base portion 260 includes an upper opening 278 that receives the first support shaft 220 therethrough, with a small gap "g" formed between the base portion and the first support shaft. The base portion 260 has a lower rim portion 260A that surrounds the first support shaft 220 and extends into a lower opening 263 in the base plate 236. As can be seen, the lower opening 263 is sized so that when the lower rim portion 260A is centered in the lower opening, the side surfaces 259 of the lower rim portion 260A is offset from the side 279 of the lower opening by a width "CW" on at least two sides. This clearance width "CW" may be sufficient to provide clearance for the first support shaft 220 to move and change the width "w" of the aperture 210. In some embodiments the first support shaft 220 can move in two directions from the illustrated nominal opening width. As arranged, the lower rim portion 260A is movable along the first axis "A" within the lower opening 263. A seal member 280 may be coupled to an end surface 282 of the lower rim portion 260A. The seal member 280 may have a seal opening 284 that receives the first support shaft 220 therethrough. The seal opening 284 may be sized similarly to the upper opening 278 in the base portion 260 to provide a high aspect ratio channel 286, which in operation can minimize the formation of deposits (due to ions in the ion beam) on the first support shaft housing 232. In operation, the seal member 280 may move along the first axis "A" with the base portion 260 to substantially cover the lower opening 263 in the base plate 236.

It will be appreciated that during wafer processing operations, the aperture portion 202 of the mass resolving slit assembly 200 will be subject to high vacuum conditions (e.g., $1 \times 10^{-5}$ to $1 \times 10^{-7}$ Torr), while conditions the actuation portion 204 is at ambient conditions. Due to the existence of such a high differential pressure across the base plate 236 and base portion 260, gases from the ambient atmosphere will tend to migrate between the base plate and the base portion, causing contamination and potentially adversely affecting process chamber conditions. An appropriate sealing arrangement may, therefore, be provided between the base plat 236 and base portion 260 so that air from the ambient atmosphere does not enter the process chamber during operation.

To provide a seal against the ingress of air or other gas into the process chamber during operation, a differential pumping region may be provided in a portion of the base portion 260 that contacts the base plate 236. In the illustrated embodiment, the sealing arrangement includes first and second O-rings 288, 290 disposed in correspondingly shaped circular recesses 292, 294 formed in the base portion 260. A differentially pumped groove 296 may be formed in the base portion 260. The circular recesses 292, 294 and differentially pumped groove 296 may be arranged to form individual continuous openings surrounding the lower opening 263 in the base plate. The back end of the differentially pumped groove 296 may be coupled to a suction source, or sources, (not shown) configured to draw gas out through the groove. Thus, any air or other gas traveling from the ambient and/or between the base portion 260 and the base plate 236 can be drawn out through the differentially pumped groove 296 before reaching the process chamber, thus minimizing or eliminate entry of gas from the air bearing or the ambient atmosphere to the process chamber.

It will be appreciated that although the illustrated embodiment employs a differential pumping region to seal the process chamber from the ambient and the air bearing, other sealing arrangements could be used. For example, a lip seal arrangement could be used in lieu of, or in addition to, the series of pumped groove. In addition, greater numbers of grooves and/or o-ring seals can be used, as desired.

As will be appreciated, movement and sealing of the first and second support shafts 220, 222 along the second axis "B" is accommodated by the previously described bellows arrangement of the first and second support shaft housings 232, 234. Alternatively, movement along the second axis "B" may be accommodated by a differentially pumped lip seal.

Figure 8A:
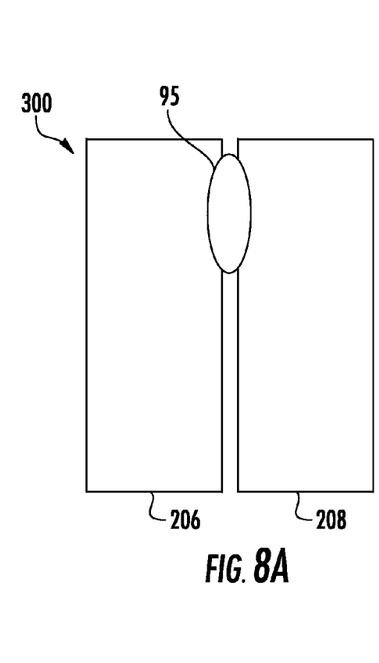
FIGS. 8A-8C are diagrams illustrating exemplary positions of the mass-resolving slit in relation to an exemplary ion beam.
Figure 8B:
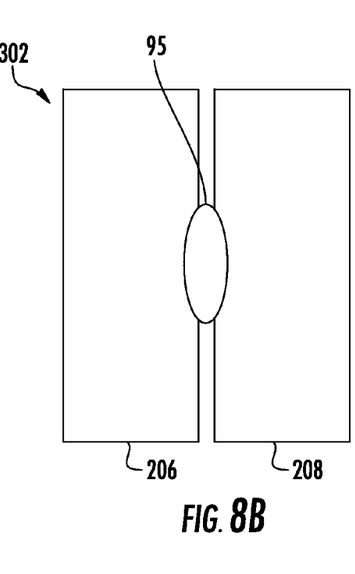
Figure 8C:
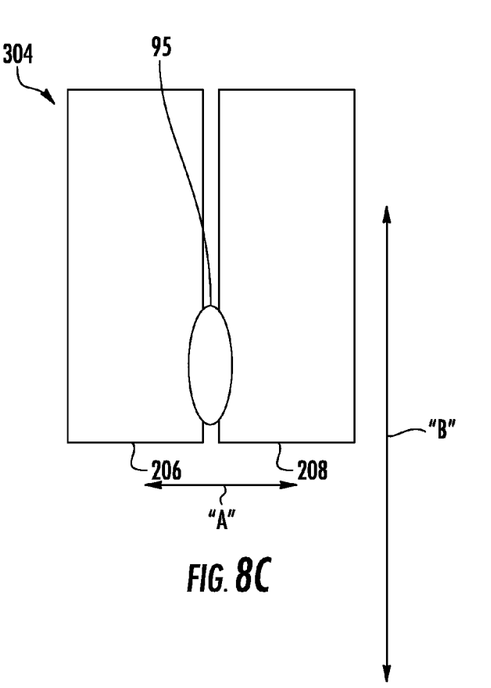

FIGS. 8A-8C show the relative positions of the ion beam 95 and the first and second shield members 206, 208. In FIG. 8A, the first and second shield members 206, 208 are positioned along the second axis "B" so that the ion beam 95 impinges a first region 300 of the first and second shield members. In FIG. 8B, the first and second shield members 206, 208 are repositioned along the second axis "B" so that the ion beam 95 impinges a second region 302 of the first and second shield members. In FIG. 8C, the first and second shield members 206, 208 are further repositioned along the second axis "B" so that the ion beam 95 impinges a third region 304 of the first and second shield members. As will be appreciated, over time the ion beam 95 will erode portions of the first and second shield members that it contacts. With the disclosed arrangement, however, as the ion beam 95 erodes the first region 300 of the first and second shield members (FIG. 8A), the second and third regions 302, 304 (FIGS. 8B, 8C) are not eroded. Thus, when the first region 300 of the first and second shield members 206, 208 becomes eroded by a predetermined amount, the first and second shield members can be moved along the second axis "B" so that a new, un-eroded region of the first and second shield members is impinged by the ion beam 95. As will be appreciated, the disclosed arrangement advantageously prolongs the time between replacements of the first and second shield members.

In some embodiments, adjusting the position of the first and second shield members 206, 208 along the second axis "B" can be performed during beam tuning to avoid undesirable changes in the ion beam 95 or particle generation. In other embodiments, the adjustment can be performed continually, or in step-wise fashion during operation. The position would be adjusted enough, at each step, to uniformly erode the first and second shield members 206, 208 along their lengths. It will be appreciated that although three discrete positions of the first and second shield members 206, 208 are shown in FIGS. 8A-8C, that greater or fewer discrete positions can also be used, as desired.

Figure 9:
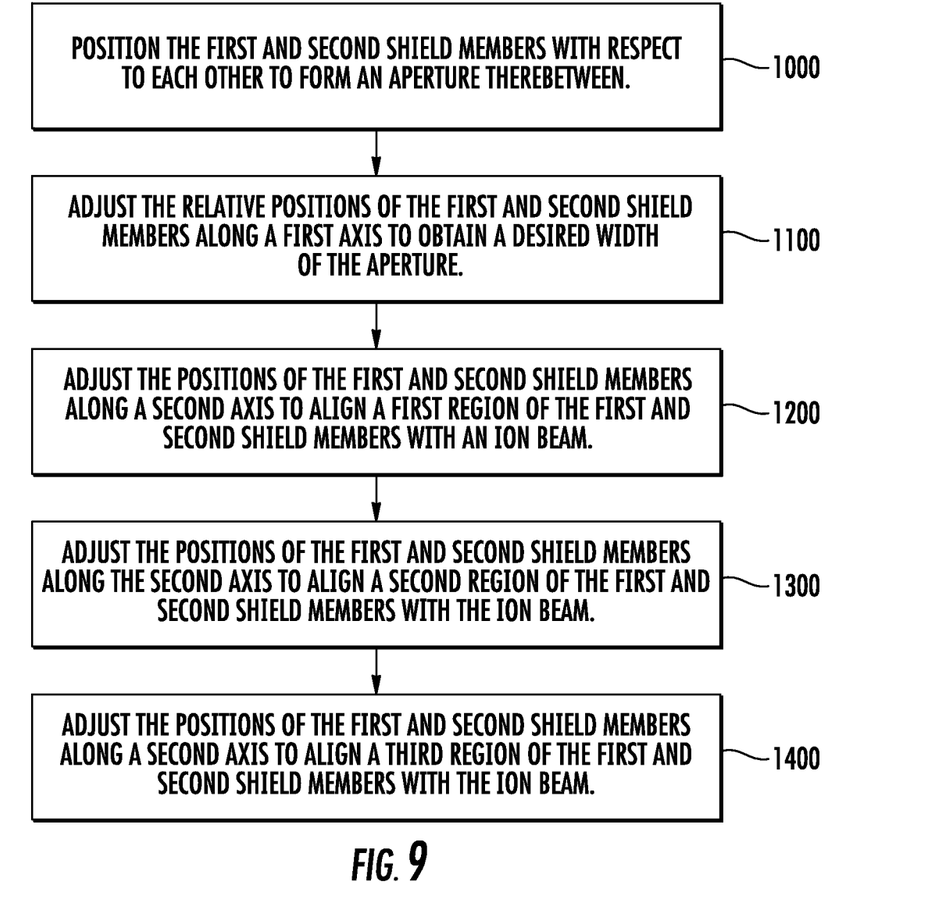
FIG. 9 is a flow diagram illustrating an exemplary method according to the disclosure.

An exemplary method for adjusting the positions of first and second shield members 206, 208 of a mass resolving slit assembly 200 will now be described in relation to FIG. 9. At step 1000, the first and second shield members 206 are positioned with respect to each other to form an aperture 210 therebetween through which an ion beam 95 can pass during semiconductor processing operations. At step 1100, the relative positions of the first and second shield members 206, 208 are adjusted along a first axis "A" to obtain a desired aperture width "W" of the aperture 210. In some embodiments this adjustment of the aperture width "W" comprises an ion beam tuning operation. At step 1200, the positions of the first and second shield members 206, 208 are adjusted along a second axis "B" to align a first region 300 of the first and second shield members with the ion beam 95. In some embodiments, the first and second axes "A," "B," are orthogonal to each other. At step 1300, the position of the first and second shield members 206, 208 are adjusted along a second axis "B" to align a second region 302 of the first and second shield members with the ion beam 95, the second region 302 being different from the first portion 300. At step 1400, the position of the first and second shield members 206, 208 are adjusted along a second axis "B" to align a third region 304 of the first and second shield members with the ion beam 95, the third region 304 being different from the first and second regions 300, 302. It will be appreciated that the first and second shield members 206, 208 may be adjusted in any manner desired to provide uniform wear adjacent to the aperture 210. In some embodiments the first and second shield members 206, 208 may be randomly moved to move the aperture in a manner that will increase the likelihood of uniform wear. In other embodiments the first and second shield members 206, 208 may be replaced at regular service intervals.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. While the invention has been disclosed with reference to certain embodiments, numerous modifications, alterations and changes to the described embodiments are possible without departing from the spirit and scope of the invention, as defined in the appended claims. Accordingly, it is intended that the present invention not be limited to the described embodiments, but that it has the full scope defined by the language of the following claims, and equivalents thereof.

What is claimed is:

1. An adjustable mass-resolving slit assembly, comprising:
    an aperture portion comprising first and second shield members that define an aperture therebetween for receiving an ion beam during semiconductor processing operations; and
    an actuation portion coupled to the aperture portion, the actuation portion for selectively and independently adjusting a position of the first and second shield members along first and second non-parallel axes, the first and second axes defining a plane oriented substantially perpendicular to the ion beam;
    wherein adjusting the position of the first and second shield members along the first axis adjusts a width of the aperture; and
    wherein adjusting the position of the first and second shield members along the second axis adjusts a region of the first and second shield members impinged by the ion beam.

2. The adjustable mass-resolving slit assembly of claim 1, further comprising:
    first and second support shafts coupled to the first and second shield members, the first and second support shafts further coupled to associated first and second support shaft housings positioned on a base plate of the actuation portion;

wherein the first and second support shaft housings are fixed along the second axis with respect to the base plate; and wherein the first support shaft housing is movable along the first axis with respect to the base plate, while the second support shaft housing is fixed along the first axis with respect to the base plate.

3. The adjustable mass-resolving slit assembly of claim 2, wherein the first and second support shafts are movable along second axis within their respective first and second support shaft housings.

4. The adjustable mass-resolving slit assembly of claim 2, wherein the first support shaft and the first support shaft housing are movable toward or away from the second support shaft and the second support shaft housing along the first axis.

5. The adjustable mass-resolving slit assembly of claim 2, wherein the first and second support shaft housings are coupled to respective first and second housing frames, the first and second housing frames positioned adjacent to their respective first and second support shaft housings and each have a guide track for slidingly engaging a guide portion of the associated first or second support shaft housing; and wherein the first and second support shaft housings are slidable on the first and second housing frames along the second axis.

6. The adjustable mass-resolving slit assembly of claim 1, the actuation portion further comprising first and second linear actuators, the first linear actuator coupled to the first support shaft to move the first support shaft along the first axis, the second linear actuator coupled to a housing frame to controllably move the second support shaft housing and the second support shaft along the second axis.

7. The adjustable mass-resolving slit assembly of claim 6, wherein a first support shaft housing and a second support shaft housing are coupled together so that movement of the second support shaft housing along the second axis causes the first support shaft housing to move along the second axis by the same amount.

8. The adjustable mass-resolving slit assembly of claim 7, the coupling between the first and second support shaft housings comprising a shaft fixed to a second flange portion of the second support shaft housing, wherein the shaft is received in a correspondingly sized recess formed in a first flange portion associated with the first support shaft housing, wherein the shaft and recess are oriented to align with the second axis so that the first and second support shaft housings can move with respect to each other along the first axis, while being coupled together for movement along the second axis.

9. The adjustable mass-resolving slit assembly of claim 2, wherein the first and second support shaft housings comprise bellows elements configured to expand and contract to facilitate movement of the first and second support shafts along the second axis.

10. A method for adjusting a mass-resolving slit in ion implantation system, comprising:

adjusting a relative position of first and second shield members along a first axis to adjust the width of an aperture formed therebetween; and adjusting a position of the first and second shield members along a second axis to select a region on the first and second shield members against which an ion beam impinges;

wherein the second axis is non-parallel to the first axis, and wherein the first and second axes define a plane oriented substantially perpendicular to the ion beam; and wherein an actuation portion selectively and independently adjusts the position of the first and second shield members along the first and second non-parallel axes.

11. The method of claim 10, wherein adjusting the relative position of first and second shield members along a first axis is performed as part of an ion beam tuning process.

12. The method of claim 10, wherein adjusting the position of the first and second shield members along the second axis is performed after the region of the first and second shield members have been eroded by a predetermined amount by the ion beam.

13. The method of claim 10, wherein adjusting the position of the first and second shield members along the second axis is performed after the first and second shield members have been subjected to a predetermined service time.

14. The method of claim 10, wherein adjusting the relative position of first and second shield members along the first axis and adjusting a position of the first and second shield members along the second axis are performed using first and second linear actuators.

15. The method of claim 14, wherein adjusting a position of the second shield member using the second linear actuator causes the first shield member to be moved by the same amount as the second shield member.

16. The method of claim 10, wherein adjusting the position of the first and second shield members along the second axis is performed while maintaining the first and second shield members in a high vacuum environment.

17. An adjustable mass-resolving slit assembly, comprising:

an aperture portion comprising first and second shield members that define an aperture therebetween for receiving an ion beam during semiconductor processing operations; and an actuation portion coupled to the aperture portion, the actuation portion comprising first and second support shafts coupled to the first and second shield members, the first and second support shafts further coupled to associated first and second support shaft housings positioned on a base plate of the actuation portion;

wherein the first support shaft housing is movable along a first axis with respect to the base plate, while the second support shaft housing is fixed along the first axis with respect to the base plate;

wherein the first and second support shaft housings are movable along a second axis that is non-parallel to the first axis, the first and second axes defining a plane oriented substantially perpendicular to the ion beam;

wherein adjusting the position of the first and second shield members along the first axis adjusts a width of the aperture; and wherein adjusting the position of the first and second shield members along the second axis adjusts a region of the first and second shield members impinged by the ion beam.

18. The adjustable mass-resolving slit assembly of claim 17, wherein the first and second support shaft housings comprise bellows elements configured to expand and contract to facilitate movement of the first and second support shafts along the second axis.

19. The adjustable mass-resolving slit assembly of claim 17, the actuation portion further comprising first and second linear actuators, the first linear actuator coupled to the first support shaft to move the first support shaft along the first axis, the second linear actuator coupled to a housing frame to controllably move the second support shaft housing and the second support shaft along the second axis.

20. The adjustable mass-resolving slit assembly of claim 19, the first and second support shaft housings are coupled together so that movement of the second support shaft housing along the second axis causes the first support shaft housing to move along the second axis by a same amount.

* * * * *